United States Patent [19]

Matsuo et al.

[11] Patent Number: 5,058,059
[45] Date of Patent: Oct. 15, 1991

[54] MEMORY CIRCUIT HAVING A REDUNDANT MEMORY CELL ARRAY FOR REPLACING FAULTY CELLS

[75] Inventors: Masahiko Matsuo; Kazuo Nakaizumi, both of Tokyo, Japan

[73] Assignee: NEC Corporation, Tokyo, Japan

[21] Appl. No.: 528,986

[22] Filed: May 25, 1990

[30] Foreign Application Priority Data

May 25, 1989 [JP] Japan ............................... 1-132109

[51] Int. Cl.$^5$ .......................................... G11C 17/16
[52] U.S. Cl. ..................................... 365/96; 365/104; 365/200; 365/230.03; 307/202.1; 307/441; 307/449; 307/468; 371/10.3
[58] Field of Search ............ 365/200, 96, 104, 230.03; 307/202, 441, 449, 468; 371/10.3

[56] References Cited

U.S. PATENT DOCUMENTS

| | | | |
|---|---|---|---|
| 4,538,245 | 8/1985 | Smarandoiu et al. ................ | 365/200 |
| 4,590,388 | 5/1986 | Clemons et al. ..................... | 365/200 |
| 4,630,241 | 12/1986 | Kobayashi et al. .................. | 365/200 |
| 4,633,429 | 12/1986 | Lewandowski et al. ............ | 365/200 |
| 4,860,256 | 8/1989 | Devin et al. ........................ | 365/200 |

Primary Examiner—Joseph E. Clawson, Jr.
Attorney, Agent, or Firm—Sughrue, Mion, Zinn, Macpeak & Seas

[57] ABSTRACT

A memory circuit having a regular memory cell group, a redundant memory cell group, and an improved redundant decoder circuit for selecting the redundant memory cell group if there is any defect in the regular memory cell group. The redundant decoder circuit includes first and second programming circuits, and it is inoperative when the first programming circuit has not been programmed, operative when the first program element has been programmed and the second programming circuit has not been programmed, and inoperative when the second program circuit has been programmed.

4 Claims, 5 Drawing Sheets

MEMORY CIRCUIT HAVING A REDUNDANT MEMORY CELL ARRAY FOR REPLACING FAULTY CELLS

BACKGROUND OF THE INVENTION

The present invention relates to a memory device, and more particularly to a memory circuit formed in a semiconductor memory device and having a redundant memory cell array for replacing a faulty cell or cells in a regular memory cell array.

In order to increase the fabrication yield of memory devices, there has been proposed a technique to relieve a memory chip whose regular memory cell array involves a faulty cell or cells by providing a redundant memory cell array in addition to the regular one and functionally replacing a faulty cell or cells with a good memory cell in the redundant array. Although there is a high demand for the use of memory devices, such as, those formed over gallium arsenide substrates for performing a required operating speed in large scale computers and measuring equipments, their fabrication yield is not high enough because of the ununiformity of the substrate crystals, peculiar to chemical compound semiconductors, and the unstable control of the fabricating process.

There is under study a method to relieve memory devices having defects in memory cells and to improve the currently low fabrication yield of such memory devices by keeping always unselectable the faulty memory cell-containing column or row in a regular memory cell array in such devices, and replacing the faulty cells with good memory cells in the redundant column or row, as the case may be.

In such a memory circuit, a regular decoder is provided for the regular memory cell array, and a redundant decoder is provided for the redundant memory cell array. The regular decoder has a regular decoder unit for each column or row of the regular memory cell array, and the redundant decoder has a redundant decoder unit for each column or row of the redundant memory cell array. The regular decoder unit is made operative before programing the redundant decoder by using a fuse or some other program element continued therein, such as blowing the fuse. The regular decoder selecting the faulty cell in a regular memory cell array is made inoperative after the programming is finished. The redundant decoder is made inoperative before the programming is performed thereto, and operative after they are programmed. A memory chip, after being fabricated, is tested for detecting faults in memory cells in the regular array by using the regular decoder. If testing reveals the presence of any faulty memory cells in the regular array, the program element in the regular decoder unit for selecting this faulty cell is programmed to make this decoder unit inoperative, while the program elements in the redundant decoder unit are programmed to make it operative. Thus a memory cell in the redundant array is selected to replace the faulty memory cell in the regular array.

At this time, however, the redundant decoder is in an inoperative state, so that the memory cells in the redundant array are not tested. This is because that it is assumed all the memory cells in the redundant array are satisfactory. Furthermore, fuses are generally used as the program elements, and the programmed action on a fuse, i.e. blowing, is not reversible. Therefore, once a program element, i.e. a fuse, in the redundant decoder unit is blown to make this redundant unit operative, the memory chip can no longer be relieved even if the memory cell in the redundant array is faulty. Therefore, the redundant structure in the prior art is limited in its contribution to increasing the fabrication yield.

SUMMARY OF THE INVENTION

An object of the present invention is to provide a memory circuit having an improved redundant structure which further raises the relieving efficiency for faulty memory cells and increases the fabrication yield.

Another object of the invention is to provide a memory circuit permitting the relief of the regular memory cell array for any faulty cell or cells therein even if the redundant array also has a faulty memory cell or cells.

A memory circuit according to the invention is characterized in that it has a redundant decoder system which, after once being made operative to select one redundant cell by a first programming operation, is then changed to select another redundant cell by a second programming.

According to the present invention, there is provided a memory circuit comprising a plurality of regular memory cells arranged in a matrix form of columns and rows; redundant memory cells arranged in at least two columns or rows; a plurality of regular word lines and redundant word lines provided for the regular and redundant memory cells, respectively; a regular decoder circuit for selecting one of the regular word lines; and a redundant decoder circuit which is provided corresponding to the redundant columns or rows and keeps, in the absence of any faulty memory cell among the regular memory cells, the corresponding redundant word line always unselectable and, in the presence of any faulty memory cell among the regular memory cells, selectively enables the corresponding redundant word line, wherein the redundant decoder circuit is provided with a fuse which, by being cut off, keeps the redundant word lines or digit lines always unselectable.

According to the present invention, even after the fuse of a redundant decoder unit is once cut off, if any one or more of the memory cells of the redundant array are faulty, the redundant decoder unit can be kept always unselectable and switching to another redundant decoder unit can be achieved, so that, even in the presence of any faulty memory cell in the redundant array, the regular array can be relieved of any faulty memory cell therein by so changing the selection of the revived redundant decoder unit as to replace this faulty redundant memory cell with another redundant memory cell.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
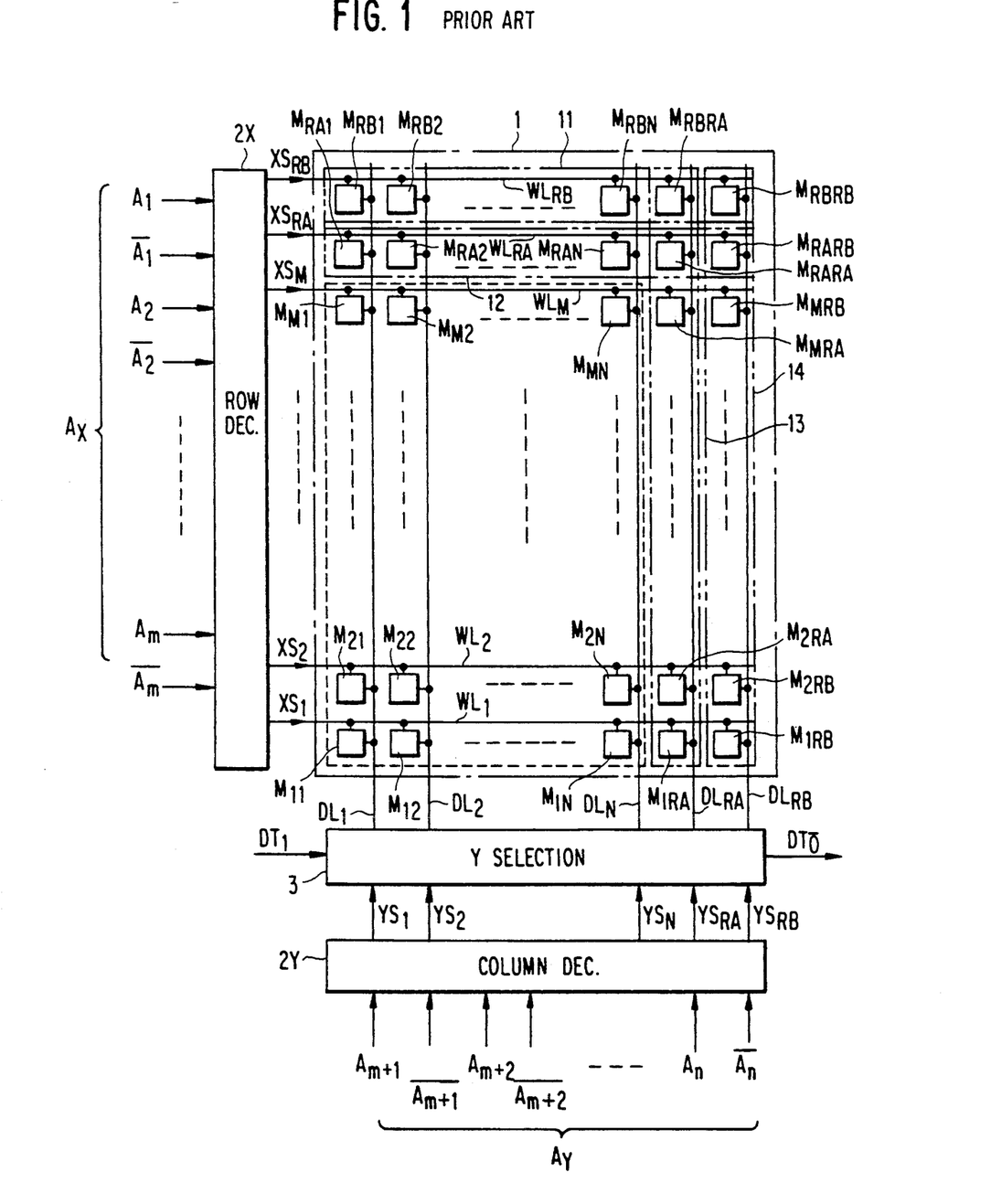
FIG. 1 is a block diagram illustrating the overall configuration of a memory circuit having a redundant structure.

A memory circuit by the prior art will first be described with reference to FIGS. 1 to 3. FIG. 1 is a block diagram illustrating an example of a conventional memory circuit. The memory cell array 1 of this memory circuit is provided with regular memory cells $M_{11}$ to $M_{MN}$ arranged in M rows and N columns, respectively, in a matrix; $2(N+2)+2M$ redundant memory cells $M_{RA1}$ to $M_{RAN}$, $M_{RARA}$, $M_{RARB}$, $M_{RB1}$ to $M_{RBN}$, $M_{RBRA}$, $M_{RBRB}$, $M_{1RA}$ to $M_{MRA}$, and $M_{1RB}$ to $M_{MRB}$ to constitute redundant rows 11 and 12 and redundant columns 13 and 14; and word lines $WL_1$ to $WL_M$, $WL_{RA}$ and $WL_{RB}$, and digit lines $DL_1$ to $DL_N$, $DL_{RA}$ and $DL_{RB}$ for selecting one of these memory cells.

A row decoder circuit 2X selectively activates one of the word lines $WL_1$ to $WL_M$ in accordance with address signals $A_X(A_1, \overline{A_1}$ to $A_m, \overline{A_m})$ if there is no faulty memory cell among the regular memory cells $M_{11}$ to $M_{MN}$. If a faulty memory cell is present in the memory cells $M_{11}$ to $M_{MN}$, and the address signals correspond to the word line for the row in which the faulty memory cell is present, the decoder 2X makes the redundant row 11 selectable and keeps the word line coupled to the faulty cell unselectable. If any faulty memory cell is present in a row in the memory cells $M_{11}$ to $M_{MN}$ other than the row replaced with the above redundant row 11, and also the word line for the row in which this other faulty memory cell is present, the decoder 2X makes the redundant row 12 selectable.

Here the M rows of the memory cell array 1 and the m bits of the address signals $A_X$ are in a known relationship of $M=2^m$.

A column decoder circuit 2Y supplies selection signals $YS_1$ to $YS_N$ which selectively controls the digit lines $DL_1$ to $DL_N$ in accordance with address signals $A_Y(A_{m+1}, \overline{A_{M+1}}$ to $A_n, A_n)$ if there is no faulty memory cell among the regular memory cells $M_{11}$ to $M_{MN}$ when there are faulty memory cells but in no more than two, the column decoder circuit 2Y calls a column in which another faulty memory cell is present than those replaced with the redundant rows 11 and 12, keeps unselectable the digit line for the column having the faulty memory cell and replaces the called column with the column 13, and makes the redundant column 13 selectable, and keeps unselectable, if faulty memory cells are present in four different rows and four different columns in the memory cells $M_{11}$ to $M_{MN}$. Also, the digit line for the column in which the faulty cells are present to replace another column, other than the faulty memory cells replaced with the redundant rows 11 and 12 and the redundant column 13, with the redundant column 14 selectable.

Here the N columns of the memory cell array and the (m-n) bits of the address signals $A_Y$ are in a known relationship of $N=2^{(m-n)}$.

An input/output circuit 3 inputs data $DT_1$ to and outputs data $DT_0$ from a memory cell selected by the column decoder circuit 2X and the row decoder circuit 2Y.

Figure 2:
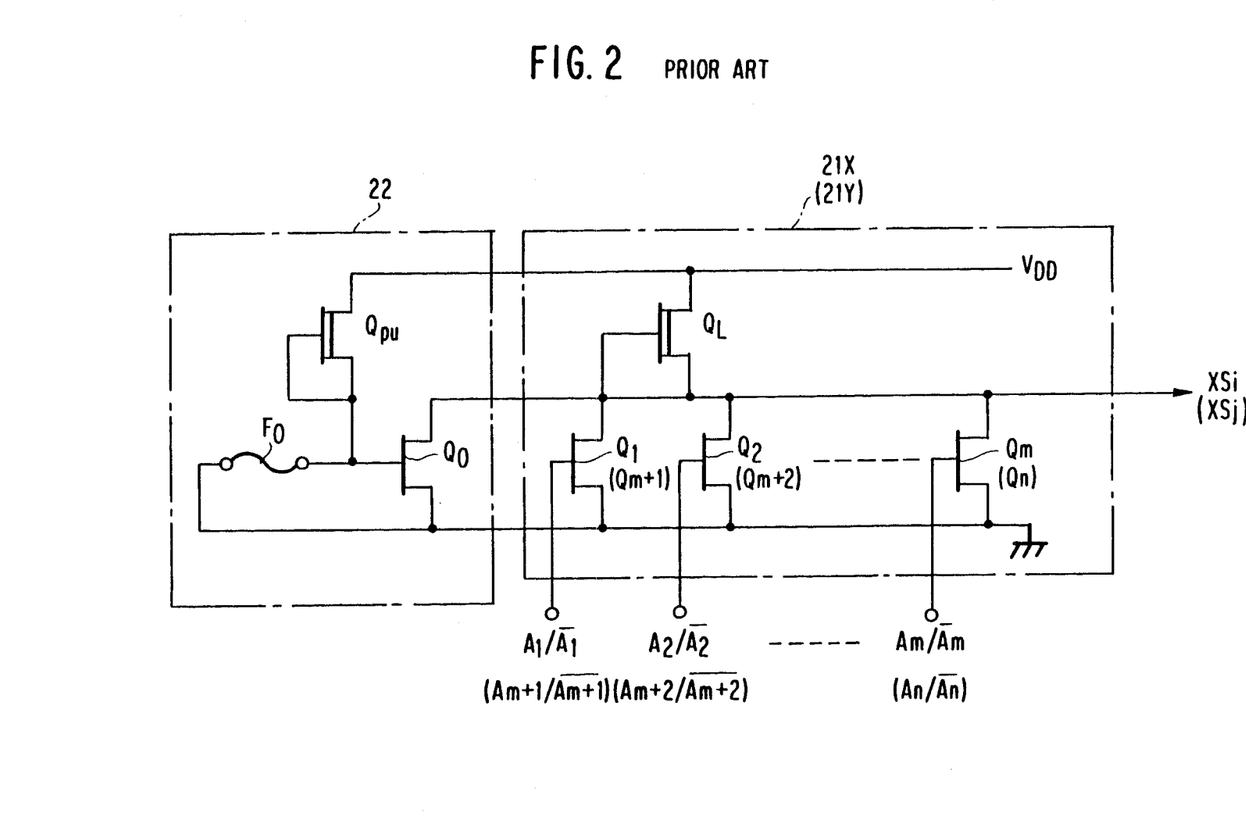
FIG. 2 is a circuit diagram illustrating the regular decoder unit of a memory circuit by the prior art.

The column decoder circuit 2X and the row decoder circuit 2Y are provided with a decoder unit circuit each having a NOR circuit, such as shown in FIG. 2, for the word lines $WL_1$ to $WL_M$ and the digit lines $DL_1$ to $DL_M$.

The following description mainly refers to the row decoder units, with references to the column decoder units parenthesized.

A NOR circuit 21X (21Y), provided with enhancement type field effect transistors (FET's) $Q_1(Q_{m+1})$ to $Q_m(Q_n)$ and a depression type FET $Q_L$, outputs a high level, when one of address decode signals $A1/\overline{A1}$ ($A_{m+1}/\overline{A_{m+1}}$) to $Am/\overline{Am}$ ($An/\overline{An}$) corresponding to one of the word lines $WL_1$ to $WL_M$ (digit lines $DL_1$ to $DL_M$) is input (when all the bits are at a low level), to make the word line (digit line) selectable.

A redundant switching circuit 22 is provided with a depression type FET $Q_{pu}$, an enhancement type FET $Q_0$ and a fuse $F_0$. In order to replace a row (column) in which a faulty memory cell is present with the redundant row 11 or 12 (redundant column 13 or 14), the circuit 22 cuts off the fuse $F_0$ for the corresponding row (column) to keep the corresponding word line (digit line) always unselectable. Therefore, the fuse $F_0$ is formed in the top layer of a multi-layered wiring structure, so that it can be cut off after the memory cell operation test following the circuit formation is completed, and so structured as to be blown off by the thermal impact of laser or the like.

Figure 3:
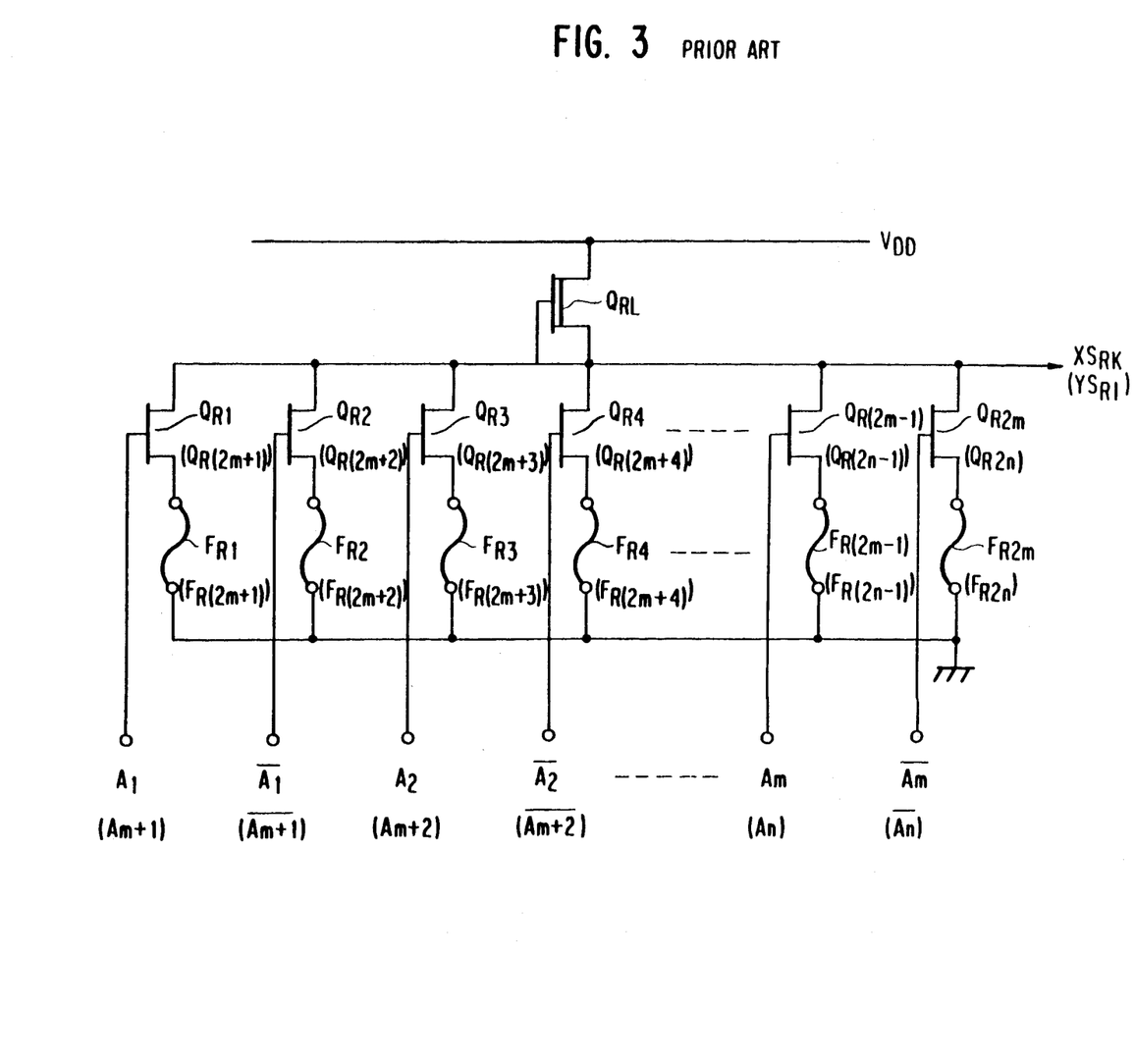
FIG. 3 is a circuit diagram illustrating the redundant decoder unit of a memory circuit by the prior art.

The row decoder circuit 2X and the column decoder circuit 2Y are provided with redundant decoder unit circuits, as shown in FIG. 3, for the redundant rows 11 and 12 and the redundant columns 13 and 14. Each redundant decoder unit circuit, having a deplection type FET $Q_{RL}$, enhancement type FET's $Q_{R1}$ ($Q_{r(2m+1)}$) to $Q_{R2m}$ ($Q_{R2n}$) and fuses $F_{R1}$ ($F_{R(2m+1)}$) to $F_{R2m}$ ($F_{R2n}$), receives both the true and complementary bits of the address signals $A_X(A_Y)$ and subjects them to NOR processing. Therefore, whenever each of the fuses $F_{R1}$ ($F_{R(2m+1)}$) to $F_{R2m}$ ($F_{R2n}$) is not blown out, the selection signal $XS_{Ri}(YS_{Rj})$ is always at a non-selection level. The structure is so designed that, when there is a faulty memory cell and the row (column) in which the faulty cell is present is to be replaced with the redundant row 11 or 12 (redundant column 13 or 14), a respective ones among the fuses $F_{R1}$ ($F_{R(2m+1)}$) to $F_{R2m}$ ($F_{R2n}$) receiving respective true and complementary address signals are cut off to select the redundant row 11 or 12 (redundant column 13 or 14) in accordance with the address signal corresponding to the row (column) in which the faulty memory cell is present.

Since the memory circuit in the prior art, described above, presupposes the absence of any faulty memory cell in the redundant cells, when switching to a redundant row (redundant column) takes place, in the corresponding redundant row (redundant column), no redundant row (redundant column) in which a faulty memory cell does exist can be replaced once the fuses $F_{R1}$ ($F_{R(2m+1)}$) to $F_{R2m}$ ($F_{R2n}$) in the redundant decoder circuit are selectively cut off. Hence, the redundant memory cell array cannot be relieved from the faulty cell therein and no memory circuit in which all the memory cells operate satisfactorily can be produced. For instance memory circuits of low fabrication yield, which are often found among compound semiconduators such as GaAs, are provided with a particularly large number of redundant rows (redundant columns) and relieved from many faulty memory cells, but the presence of faulty cells in the redundant rows (redundant columns) for replacement use is as probable as in the regular rows (regular columns) of memory cells. This means the disadvantage of difficulty to obtain perfectly operating memory circuits even if faulty regular rows (regular columns) are replaced with redundant rows (redundant cells), resulting in inadequate improvement of the fabrication yield.

Now will be described preferred embodiments of the present invention with reference to accompanying drawings. A memory circuit according to the invention can be obtained by replacing the redundant decoder unit circuits in the row decoder unit circuit 2X and the column decoder circuit 2Y for selecting the redundant rows ($XS_{RA}$, $XS_{RB}$) and the redundant columns ($DL_{RA}$, $DL_{RB}$), respectively, in the above described memory circuit of FIG. 1 with a redundant decoder unit circuit as illustrated in FIG. 4.

Figure 4:
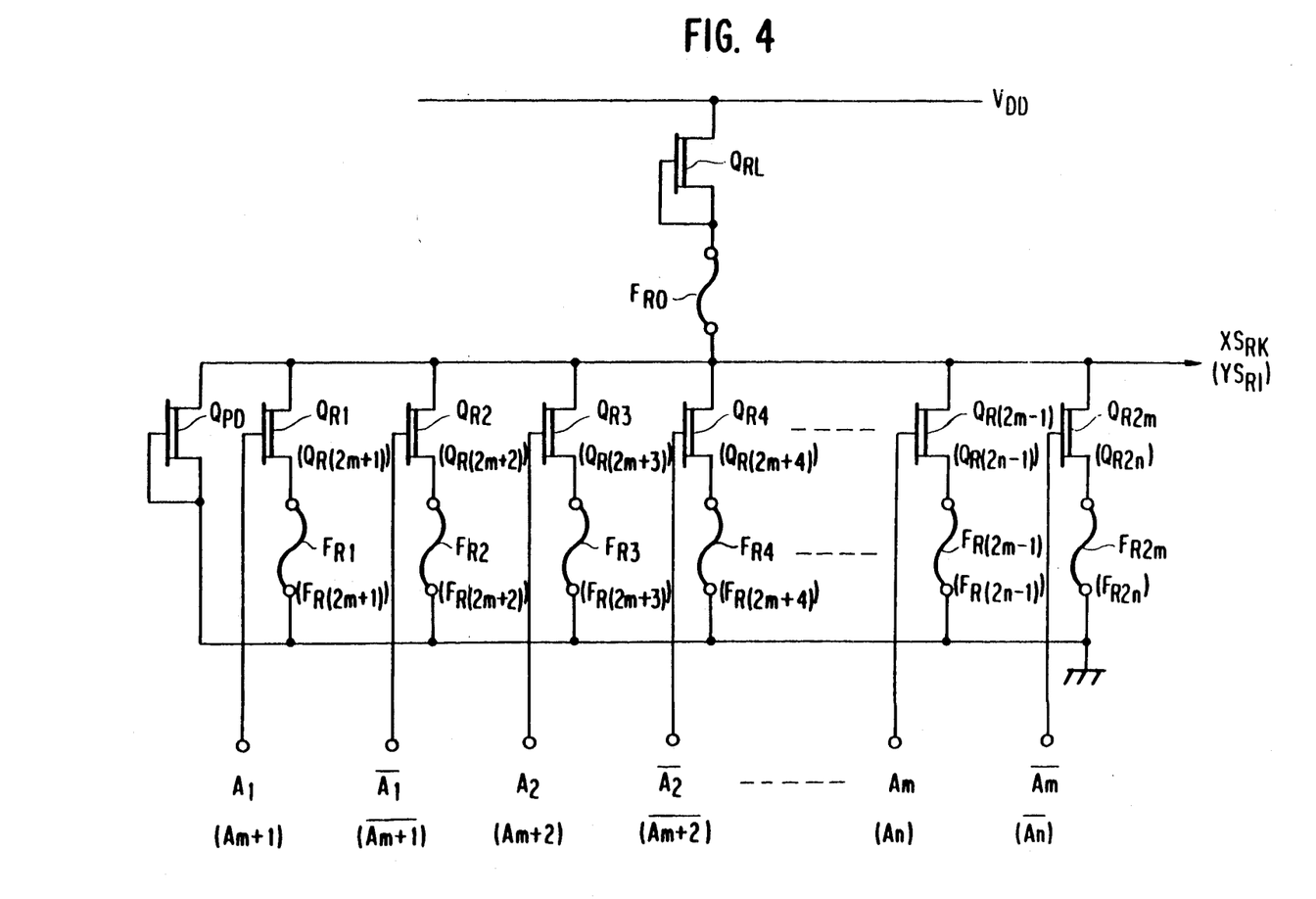
FIG. 4 is a circuit diagram illustrating the redundant decoder unit in a preferred embodiment of the present invention.

FIG. 4 illustrates the circuitry of the redundant decoder unit circuit in a first preferred embodiment of the invention. This embodiment differs from the prior art circuitry shown in FIGS. 2 and 3 in that a depletion FET $Q_{PD}$, having sufficiently lower resistance than the fuse $F_{R0}$ and the depletion FET $Q_{RL}$, is added to the conventional redundant decoder circuit shown in FIG. 3. The same regular decoder circuit as in the prior art configuration suffices in this first embodiment of the invention, and would operate in exactly the same manner as the conventional regular decoder circuit. Therefore its illustration and description are dispensed with here.

The redundant decoder circuit in this embodiment comprises enhanced type FET's $Q_{R1}$ ($Q_{R(2m+1)}$) to $Q_{R2m}$ ($Q_{R2n}$), a depletion type FET $Q_{RL}$ and fuses $F_{R0}$, $F_{R1}$ ($F_{R(2m+1)}$) to $F_{R2m}$ ($F_{R2n}$), connected in correspondence with redundant rows (redundant columns) 11 and 12 (13 and 14). If the testing of memory cells reveals none of memory cells $M_{11}$ to $M_{MN}$ for regular operation to be faulty, the fuses $F_{R1}$ ($F_{R(2m+1)}$) to $F_{R2m}$ ($F_{R2n}$) are not cut off but remain in continuity, and both the true and complementary bits of address signals AX (AY) are input, so that the output terminal $XS_{Rk}$ ($YS_{Rl}$) to word lines (digit lines) remain always at a low level for non-selection.

If the test of memory cells reveals any of the memory cells for regular operation to be faulty, the regular decoder circuit cuts off the fuse $F_0$ to keep the output of the corresponding word line (digit line) always non-selectable. In the redundant decoder circuit corresponding to the redundant row 11 (redundant column 13), the fuses $F_{R1}$ ($F_{R(2m+1)}$) to $F_{R2m}$ ($F_{R2n}$) are selectively cut off so that the redundant row 11 (redundant column 13) is selected in accordance with address signals corresponding to the row (column) to which the faulty memory cell belongs. This operation causes the row (column) containing the faulty one among the memory cells for regular operation to be replaced with the redundant row 11 (redundant column 13).

Then, if another test of the memory cells reveals none of the memory cells of regular rows or those of the redundant row 11 (redundant column 13) to be faulty, all the memory cells in the memory circuit will be able to operate satisfactorily, so that the relief for faulty memory cells by replacement with a redundant row (column) is completed.

If faulty memory cells are present in a plurality of rows (columns) of regular memory cells, the relief for the faulty memory cells can be achieved in this preferred embodiment of the invention in the same procedure as described with reference to the prior art.

In addition to the foregoing, in this embodiment, if any memory cell is found faulty in the redundant row 11 (redundant column 13) activated by the replacement, it is possible to cut off the fuse $F_{R0}$ in the corresponding redundant decoder circuit and thereby to make the once activated redundant row 11 (redundant column 13) always unselectable again. Thus, once the fuse $F_{R0}$ is cut off, the output terminal $XS_{Rk}$ ($YS_{Rl}$) to word lines (digit lines) is pulled down by the depletion FET $Q_{PD}$, irrespective of the level of the address signals AX (AY), to the low level for sustained non-selection. Further, since the equivalent resistance of $Q_{PD}$ is sufficiently greater than that of $Q_{RL}$, there is no influence on the operation of the redundant decoder circuit before the fuse $R_{R0}$ is cut off.

Relief from any faulty memory cell in the redundant row (column) can also be achieved, after making the redundant row 11 (redundant column 13) containing the faulty memory cells always unselectable, by replacing this redundant row 11 (redundant column 13) with another redundant row 12 (redundant column 14) in the same procedure as for the relief from a faulty one among the memory cells of the regular word lines.

Although the foregoing description of this preferred embodiment of the invention has been made on the case of two redundant rows and two redundant columns, the operations according to the invention can as well be applied irrespective of the numbers of redundant rows (columns).

Figure 5:
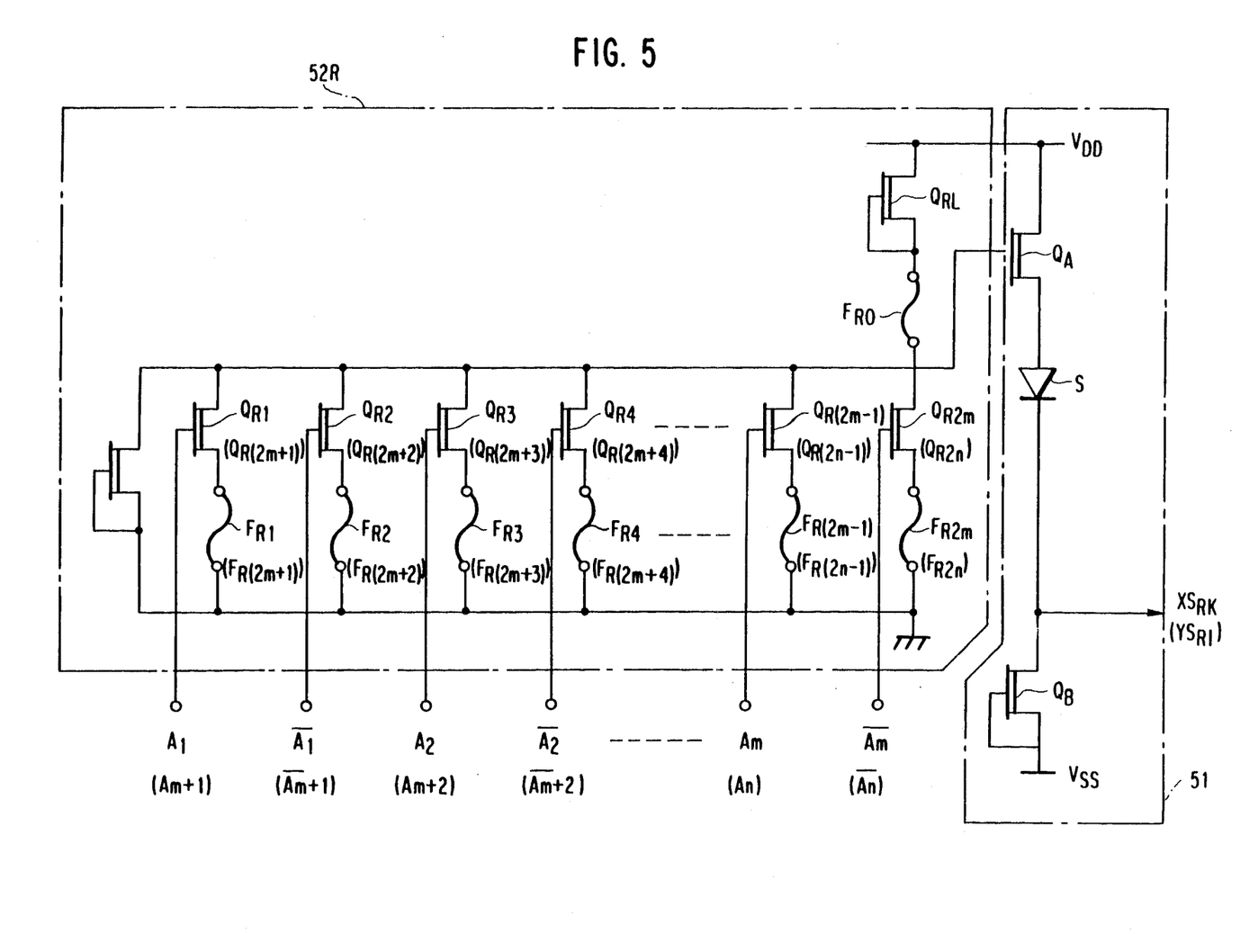
FIG. 5 is a circuit diagram illustrating the redundant decoder unit in another preferred embodiment of the invention.

FIG. 5 illustrates the circuit of the major part of a redundant decoder unit circuit, which is a second preferred embodiment of the present invention, in which depletion type FET's $Q_A$, $Q_B$, $Q_{R1}$ ($Q_{R(2m+1)}$) to $Q_{R2m}$ ($Q_{R2n}$) and $Q_{RL}$, a Schottky barrier diode S, and fuses $F_{R0}$, $F_{R1}$ ($F_{R(2m+1)}$) to $F_{R2m}$ ($F_{R2n}$) are used.

In FIG. 5, a NOR circuit 52R constitutes the major part of the redundant decoder circuit. A level shift circuit 51, having functions to keep the levels of word lines (digit lines) appropriate and to increase the load driving capability of the decoder circuit, is extensively used to ensure the stable operation of memory circuits at high speed, especially in memory circuits of compound semiconductors. In this embodiment, because all the FET's are of the depression type, there is no need to form an enhancement type FET and, because a Schottky barrier diode is relatively easy to form, parameter control on the process can be readily achieved. The procedure to relieve the redundant decoder circuits in this embodiment from faulty memory cells is exactly the same as in the first preferred embodiment described earlier.

Where any of the redundant memory cells is faulty in the prior art memory circuit, relief from that faulty memory cell was impossible, but the present invention, as hitherto described, has made it possible to relieve the redundant array from its faulty memory cells by the improved redundant decoder circuits, and thereby provides the benefit of improving the fabrication yield of memory circuits, which would otherwise be low.

What is claimed is:

1. A memory circuit including regular memory and redundant memory, and said memory circuit receiving memory address signals, said memory circuit comprising a plurality of regular memory cell groups; a plurality of redundant memory cell groups; a plurality of regular decoder unit circuits each provided for each of said regular memory cell groups; and a plurality of redundant decoder unit circuits each provided for each of said redundant memory cell groups; each of said regular decoder unit circuits having a first program element taking one of first and second states, said regular decoder unit circuit being operative when said first program element takes said first state and inoperative when said first program element takes said second state; each of said redundant decoder unit circuits including a first series circuit of a load element and a first fusible link connected directly between a first voltage terminal and an output node, first resistor means coupled between said output node and a second voltage terminal, a plurality of second series circuits coupled in parallel between said output node and said second voltage terminal, each of said second series circuits having a decoding transistor and a second fusible link connected in series between said output node and said second voltage terminal, the decoding transistor having a gate for receiving one of the memory address signals, each of said redundant decoder unit circuits being operative when said second fusible links are selectively cut and said first fusible link remains uncut, and inoperative when said first fusible link is cut.

2. A redundant decoder circuit for selecting a redundant memory cell group provided in addition to regular memory cell groups in a memory circuit and for receiving memory address signals, said redundant decoder circuit comprising a first series circuit of a load element and a first fusible link connected directly between a first voltage terminal and an output node, first resistor means coupled between said output node and a second voltage terminal, a plurality of second series circuit coupled in parallel between said output node and said second voltage terminal, each of said second series circuits having a decoding transistor and a second fusible link connected in series between said output node and said second voltage terminal, the decoding transistor having a gate or receiving one of the memory address signals, each of said redundant decoder circuits being operative when said second fusible links are selectively cut and said first fusible link remains uncut, and inoperative when said first fusible link is cut.

3. A memory circuit as recited in claim 1, wherein said load element, said resistor means and said decoding transistors are field effect transistors of the same channel conduction type.

4. A memory circuit as recited in claim 1, further comprising a level shift circuit having a third series circuit of an input transistor having a gate coupled to said output node and a diode coupled between said first voltage terminal and a level-shift output node, and a second resistor means coupled between said level-shift output node and said second voltage terminal.

* * * * *

UNITED STATES PATENT AND TRADEMARK OFFICE
CERTIFICATE OF CORRECTION

PATENT NO. : 5,058,059
DATED : October 15, 1991
INVENTOR(S) : Matsuo et al

It is certified that error appears in the above-identified patent and that said Letters Patent is hereby corrected as shown below:

Col. 3, line 41, change "$A_n$" (second occurrence) to --$\overline{A_n}$--.

Col. 4, line 7, change "A1" (second occurrence) to --$\overline{A1}$--.

Signed and Sealed this

Twentieth Day of April, 1993

Attest:

MICHAEL K. KIRK

*Attesting Officer*    *Acting Commissioner of Patents and Trademarks*